United States Patent [19]
Hirano

[11] Patent Number: 5,831,905
[45] Date of Patent: Nov. 3, 1998

[54] METHOD FOR CONTROLLING ERASURE OF NONVOLATILE SEMICONDUCTOR MEMORY

[75] Inventor: Yasuaki Hirano, Nara, Japan

[73] Assignee: Sharp Kabushiki Kaisha, Osaka, Japan

[21] Appl. No.: 819,531

[22] Filed: Mar. 17, 1997

[51] Int. Cl.⁶ .................................................. G11C 16/06
[52] U.S. Cl. ............... 365/185.29; 365/218; 365/185.24; 365/185.22
[58] Field of Search .............................. 365/185.01, 218, 365/185.22, 185.24

[56] References Cited

U.S. PATENT DOCUMENTS

| | | | |
|---|---|---|---|
| 5,239,505 | 8/1993 | Fazio et al. | 365/185.29 |
| 5,526,309 | 6/1996 | Jinho | 365/185.19 |
| 5,537,358 | 7/1996 | Fong | 365/218 |
| 5,581,503 | 12/1996 | Matsubara et al. | 365/185.33 |

FOREIGN PATENT DOCUMENTS

06139785 A  5/1994  Japan .

*Primary Examiner*—Viet Q. Nguyen
*Attorney, Agent, or Firm*—Morrison & Foerster, LLP

[57] ABSTRACT

The present invention has a structure wherein a word line erasing voltage is inhibited from being applied to a sector (each word line) in which it is decided that erasure has been completed. Consequently, a method for controlling erasure of a nonvolatile semiconductor memory is provided in which distribution of a threshold can be tight without increasing a layout area so that a threshold of a reference cell for erasure can be lowered, read can be performed without boosting the word line by using a power supply having a low voltage, and high-speed read and low power consumption can thus be realized.

5 Claims, 19 Drawing Sheets

☒ PROGRAM CELL
☐ ERASE CELL

☒ PROGRAM CELL
☐ ERASE CELL

METHOD FOR CONTROLLING ERASURE OF NONVOLATILE SEMICONDUCTOR MEMORY

BACKGROUND OF THE INVENTION

1. Field of the Invention

The present invention relates to a method for controlling erasure of a nonvolatile semiconductor memory comprising a floating gate and capable of being electrically rewritten, and more particularly to a method for applying erase pulses at the time of erasure.

2. Description of the Related Art

An ETOX (trademark of Intel in U.S.A.: EPROM with tunnel Oxide) type memory cell has been known as a flush EEPROM.

As shown in FIG. 2, the ETOX type cell has a source 22 and a drain 23 formed in a semiconductor substrate 21. The source 23 and drain 22 have polarity reverse to that of the semiconductor substrate 21. A gate insulation film 24 is formed on a portion between the source 22 and the drain 23. A floating gate 25 is formed on the gate insulation film 24. An interlayer insulation film 26 is formed on the floating gate 25. A control gate 27 is formed on the interlayer insulation film 26.

The principle of operation of the ETOX type cell is as follows. When writing data (programming), a low voltage (for example, 0 V) is usually applied as a source voltage Vs, a voltage Vd (for example, 6 V) is applied to the drain, and a high voltage Vpp (for example, 12 V) is applied to the control gate. At this time, hot electrons and hot holes are generated between the drain and the source. The hot holes flow as a substrate current into the substrate. On the other hand, the hot electrons are injected into the floating gate so that a threshold voltage is raised at the control gate of a transistor.

When reading data, a low voltage (for example, 0 V) is applied to the source, a voltage which is a little higher than the source voltage (for example, 1 V) is applied to the drain, and a voltage of 5 V is applied to the control gate. At this time, write and non-write cells have different thresholds. Consequently, currents flowing into the source and the drain are different from each other. These currents are sensed. If the current is greater than a constant current, "1" is set (a cell in which data are erased). If the current is smaller than the constant current, "0" is set (a cell to which data are written).

When erasing data, a high voltage Vpp (for example, 12 V) is applied to the source and a low voltage (for example, 0 V) is applied to the control gate. Furthermore, the drain is kept open with no voltage supplied. Consequently, a Fowler-Nordheim current flows to the floating gate and the source through a tunnel oxide film so that electrons are extracted from the floating gate.

By such principle of operation, it is verified whether or not the cells for write and erasure are equal to or more than a predetermined threshold value. In write verification, the cell is compared with a cell (reference cell) having a high threshold (Vthp) (for example, 5.3 V). If the threshold (Vthp) of the cell is equal to or more than that of the reference cell, it is decided that the same cell is the write cell. In erase verification, the cell is compared with a cell (reference cell) having a low threshold (Vthe) (for example, 3.1 V). If the threshold (Vthe) of the cell is equal to or less than that of the reference cell, it is decided that the same cell is the erase cell.

FIG. 3 shows a structure of a common source type memory array section of the flash memory according to the prior art. Address signals A6 to A16 are inputted to a word decoder 31. Data (D0 to D7) and address signals A0 to A5 are inputted to a column decoder 32. Furthermore, an erase signal E is inputted to an erase circuit 33. This chip has m word lines $WL_1$ to WLm (for example, m=2048). Each word line has control gates of n memory cells MC connected thereto (for example, n=512). In other words, each word line has n bit lines BL1 to BLn. Accordingly, this memory has (m×n) capacities (for example, 1 MB). This memory array has a common source. A common source line SL is connected to the erase circuit 33.

When writing data, a voltage Vd is applied to the bit lines of cells having data "0" and a voltage Vss is applied to the bit lines of cells having data "1". A voltage Vpp is applied to a selected word line. Desired data are written to the cell.

When reading data, a word line is selected in the same manner as in writing operation. A voltage Vcc is applied to the word line. A voltage of about 1 V is applied to a bit line. It is decided whether the data is "1" or "0" by means of a sense amplifier for a current flowing in the cell. The data is read out of an I/O.

When erasing data, an erase signal is inputted to the erase circuit. The voltage Vpp is applied to sources of memory cell transistors provided in an array as shown in FIG. 3. Consequently, the data of all the cells can be erased at the same time.

An erase sequence of the flash memory having the above-mentioned operational principle and memory structure will be described below. FIG. 4 shows a general erase sequence. Erasure is started. First of all, all the cells are brought into the writing state in order to prevent over-erasure. Then, an erase pulse is applied to perform erase verification. A cell of first address is used to perform the verification. If it is decided that a threshold of the cell is not in the erasing state, the erase pulse is applied again. At this time, all the cells are inevitably selected. If it is decided that the threshold of the cell is in the erasing state, a cell on the next address is verified. This operation is repeated until a cell of final address is verified.

Usually, memory cells in a chip have a variation in characteristics. Therefore, the cells have a variation in the thresholds after erasure. FIG. 5 shows an example of distribution of the thresholds of the cells of the memory array obtained after the erasure. As is apparent from FIG. 5, the threshold of the memory cell does not have a constant value but a value between Vthmin and Vthmax after the erasure. When the erase pulse is further applied temporarily, the value Vthmin is 0 V or less as shown in FIG. 6. Such a condition is "over-erasure".

By using a NOR type memory array forming method shown in FIG. 3, a transistor of an over-erased cell, that is, a cell having Vth<0 is turned on also in case of a word line voltage=0 V. It is decided that all data of cells connected to the bit lines on which the same cell exists are "1". Consequently, the data cannot be read out normally. Accordingly, the threshold of the cell should be 0<Vth<Vthe.

In order to prevent such over-erasure, the threshold of a reference cell for erasure is usually set to a value (for example, 3.3 V) which is much higher than 0 V as described above. Thus, a reduction in the voltage is promoted. For example, if a supply voltage is 3 V, a transistor of the reference cell is always OFF when the word line has the supply voltage. Consequently, verification and read cannot be performed accurately. Accordingly, the reading operation or the like with a power supply having a low voltage is usually performed by raising the voltage of the word line. In this method, a timing at which the word line is boosted is subtle. Therefore, it is difficult to reduce an access time and the like. Furthermore, a circuit for boosting the word line is necessary. For this reason, power consumption becomes a problem. In order to promote a reduction in the voltage, it is desired that the threshold of the reference cell should be set to a value which is at least lower than the supply voltage.

In case of chip batch erasure, however, it is anticipated that a variation in the threshold becomes more remarkable when the memory capacity is increased and an area of the memory array is increased. Consequently, it is hard to decrease the threshold of the reference cell described above.

Examples of means for solving this problem of a chip batch erasing type include a method for subdividing a chip into blocks. An example of this method has been described in "A 60 ns 16 Mb Flash EEPROM with Program and Erase Sequence Controller" ISSCC Tech Dig. P260 (1991) or Japanese Unexamined Patent Publication No. 6-139785.

FIG. 7 is a block diagram showing an array section of a split source type flash memory which has been described. As is apparent from FIG. 7, a source is split into $SL_1$ to $SL_k$ to which erase circuits $33_1$ to $33_k$ capable of applying individual voltages are connected. At the time of erasure, an erase signal E is inputted to the erase circuits respectively so that a voltage Vpp is applied to the sources. The erase circuit of the block in which it is decided by verification that erasure has been performed becomes inactive. The voltage Vpp is not applied to the same block. By this method, excessive erasure is not performed. In this case, an erase time is greatly affected by a method for erase verification. In the case where such a memory array structure uses the verification operation shown in FIG. 4, an erase pulse is simultaneously applied to only the blocks in which an insufficiently erased cell is detected on an address in the same block. Consequently, efficiency is considerably lowered. Therefore, the erase pulse is applied to blocks including the insufficiently erased cell after memory cells on a word line are completely verified. It has been described that distribution of a threshold can be tight from 2.2 eV to 1.5 eV by using this method. Thus, the distribution of the threshold (variation) can be tight by subdividing a block split.

In the case where such subdivision is performed, however, the sources are split. Consequently, it is hard to reduce an array area by using a common source as a characteristic of the flash memory. In the case where a block is split into eight parts (k=8) in a 1M block flash memory as shown in FIG. 7, a layout area is increased by about 25% as compared with the formation of a common source type by using a block forming method in an ordinary block split type flash memory.

According to the conventional method, the erase pulse is applied on voltage conditions shown in FIG. 8. In this case, the erase pulse raises a source voltage to 12 V and all word lines have a voltage of 0 V. As is apparent from the array structures shown in FIGS. 3 and 7, the pulse is applied to all the cells having a common source.

In order to make a memory array finer without increasing a layout area thereof, there is a method for applying a negative voltage to a word line to erase data. Double diffusion of the source is not needed. Consequently, the cell can be reduced more.

In this case, a source voltage is set to 6 V and a voltage of a word line is set to −10 V as shown in FIG. 9 in the array structure shown in FIG. 3. On this condition, the flash memory cell fully generates an electric field between a floating gate and a source so that electrons are extracted therefrom and erased.

According to the prior art, in the case where batch erasure of a memory array is performed in a negative voltage erasing type flash memory, a voltage of 6 V is applied to a source and a voltage of −10 V is applied to all word lines until all cells are erased. An erase sequence is the same as in FIG. 4.

Also in the case where this method is used, however, the erase pulse is applied until all the cells are erased in the same manner as in the method for applying a high voltage to the common source to erase the cells. For this reason, if the cells in the memory array have a variation in characteristics, the distribution of the threshold is increased. Consequently, it is necessary to boost the word line when performing read and verification by using the power supply having a low voltage. Thus, it is not easy to increase an access speed. Furthermore, power consumption of a booster circuit is increased.

SUMMARY OF THE INVENTION

The present invention provides a method for controlling erasure of a nonvolatile semiconductor memory wherein a word line erase voltage is inhibited from being applied to a sector (each word line) in which it is decided that erasure has been completed so that distribution of a threshold can be tight without increasing a layout area, and a threshold of a reference cell for erasure can be lowered and read can be performed without boosting the word line by using a power supply having a low voltage so that high-speed read and low power consumption can be realized.

The present invention provides a method for controlling erasure of a nonvolatile semiconductor memory having memory cells in which floating gate type MOS transistors are arranged in a matrix, control gates of the transistors are connected in common to form a word line row by row, drains of the transistors are connected in common to form a bit line column by lolumn, and sources of all the transistors are connected in common to form a common source line, comprising the steps of applying a predetermined first voltage to all the word lines while a predetermined second voltage is applied to the common source line to perform batch erasure, detecting whether or not threshold voltages of all the transistors in a word line or a group of word lines is lower than a predetermined so as to perform partial verification, applying the first voltage to a word line or a group of word lines which includes any transistor having a threshold voltage higher than the predetermined value while the second voltage is applied to the common source line so as to perform partial erasure, and repeating the partial verfication and the partical erasure until the threshold voltages of all the transistors are lower than the predetermined value.

DESCRIPTION OF PREFERRED EMBODIMENTS

Figure 1:
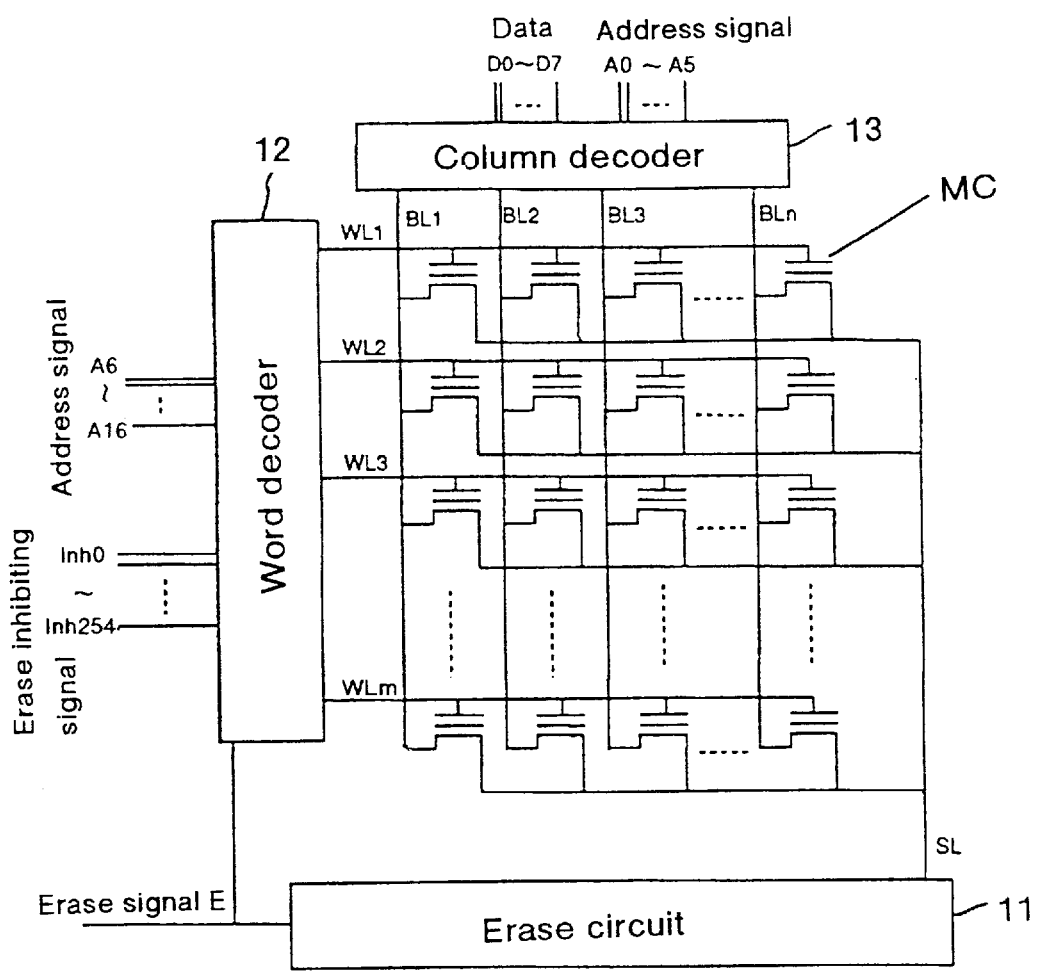
FIG. 1 is a diagram showing a structure of a memory array section according to the present invention.
Figure 2:
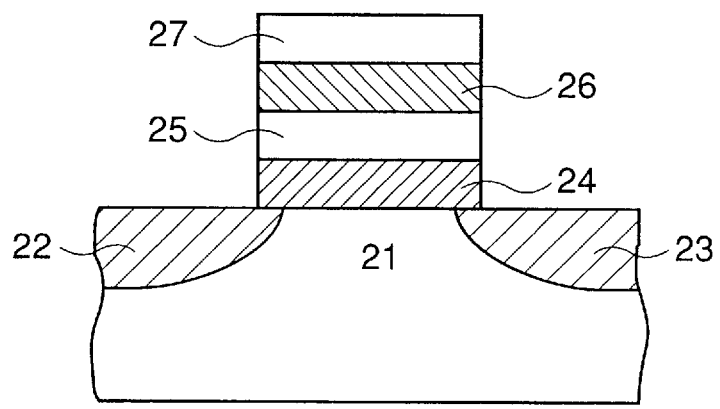
FIG. 2 is a sectional view showing an ETOX type memory cell.
Figure 3:
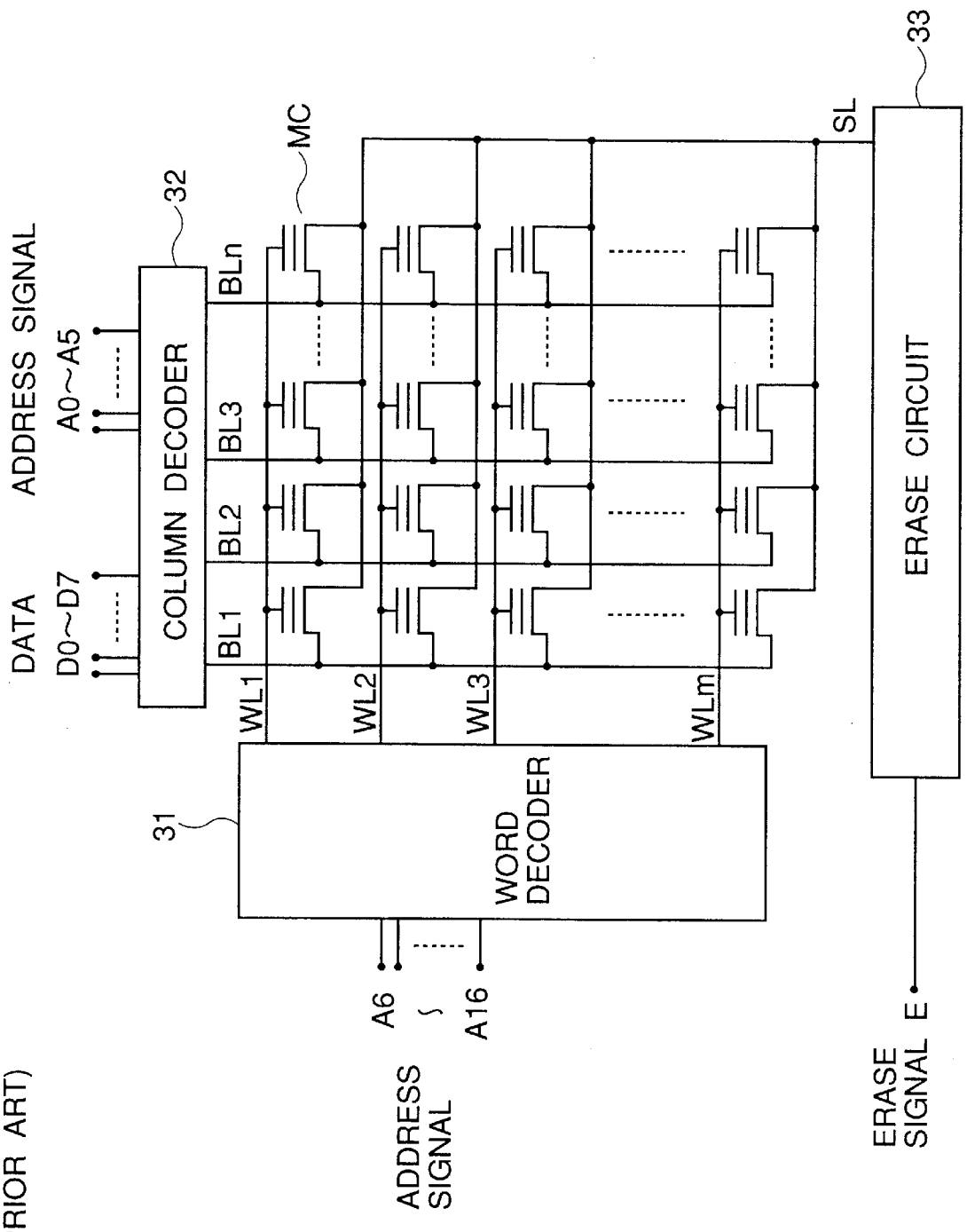
FIG. 3 is a diagram showing a structure of a common source type memory array section according to the prior art.
Figure 4:
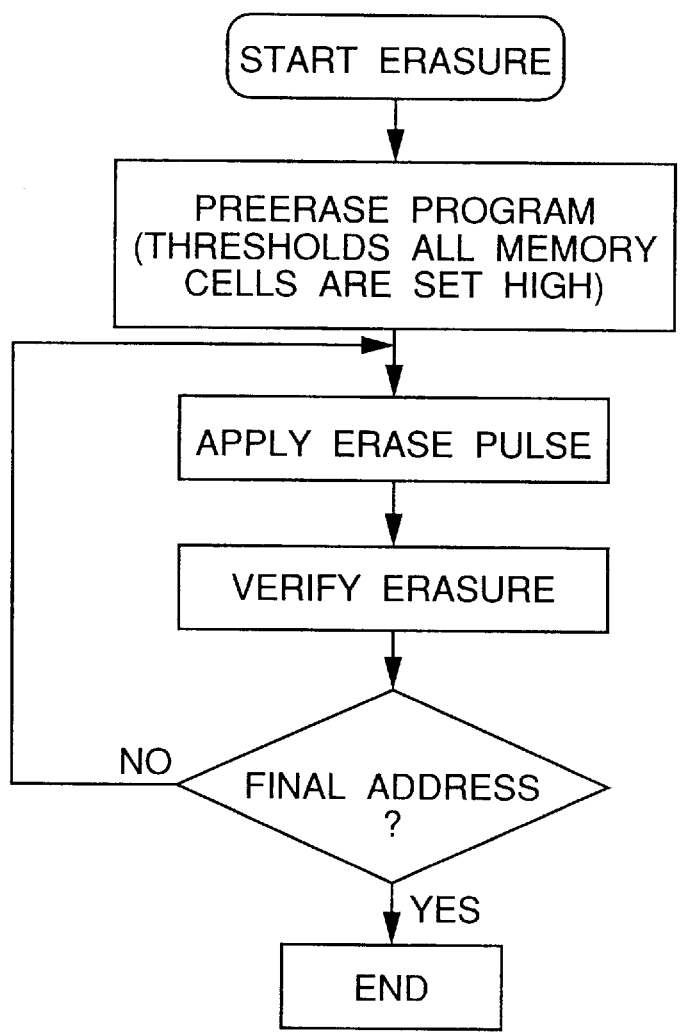
FIG. 4 is a flowchart showing an erase sequence according to the prior art.
Figure 5:
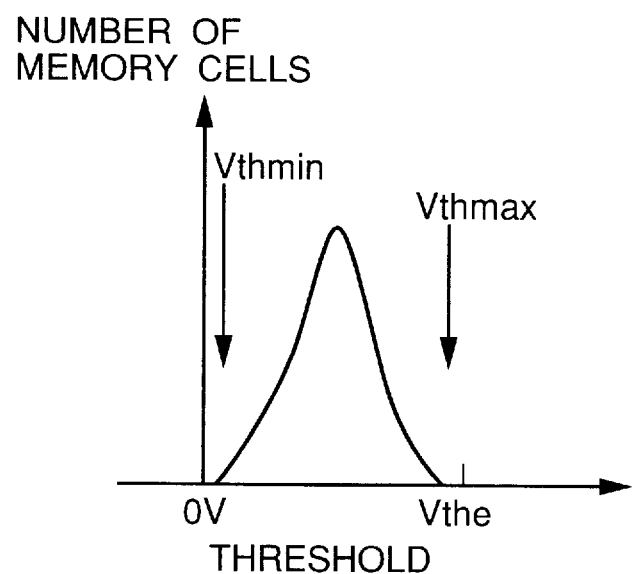
FIG. 5 is a chart showing distribution of a threshold of a memory cell obtained after erasure.
Figure 6:
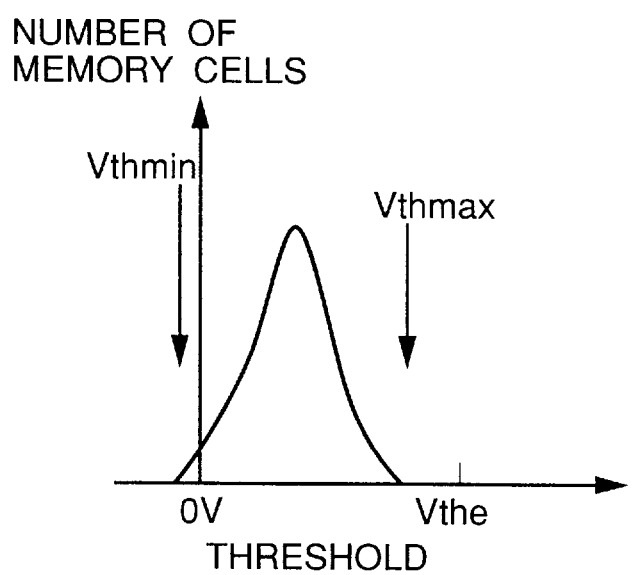
FIG. 6 is a chart showing the distribution of the threshold of the memory cell obtained when over-erasure is caused.
Figure 7:
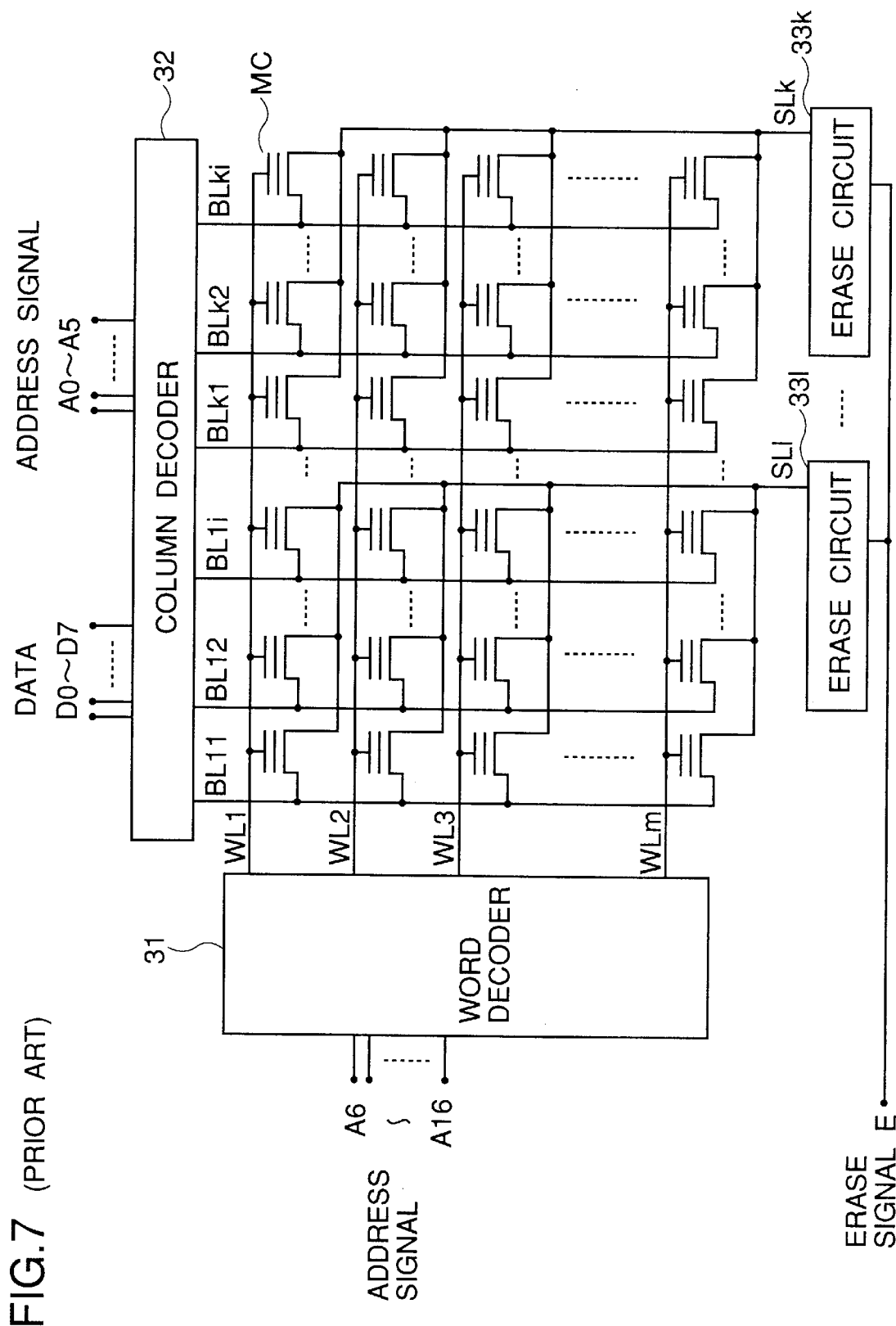
FIG. 7 is a diagram showing a structure of a split source type memory array section according to the prior art.
Figure 8:
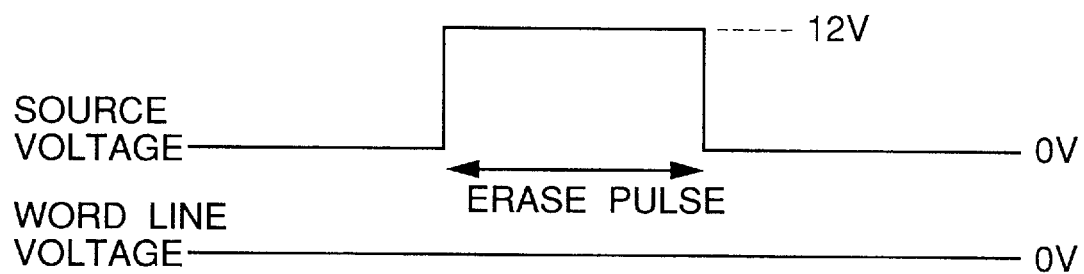
FIG. 8 is a chart showing an erase pulse applied in a source line high voltage erasing method.
Figure 9:
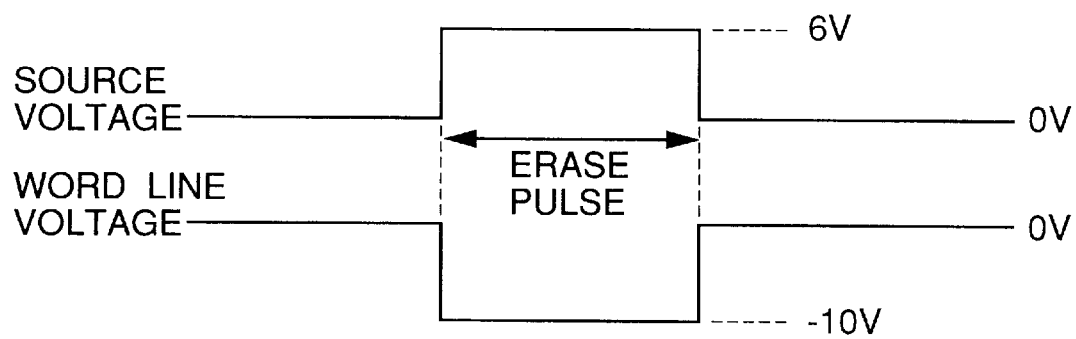
FIG. 9 is a chart showing an erase pulse applied in a word line negative voltage erasing method.

According to the present invention, a word line erase voltage is inhibited from being applied to a sector (each word line) in which it is decided that erasure has been completed in a flash memory having all sources of all memory cells connected in common to perform batch erasure as described above. Furthermore, a positive voltage is applied to the common sources so that the cells are brought into the half erasing state. In order to prevent a threshold voltage from being lowered in the half erasing state, a positive voltage is applied to the word lines.

More specifically, the present invention provides a method for controlling erasure of a nonvolatile semiconductor memory having memory cells in which floating gate type MOS transistors are arranged in a matrix, control gates of the transistors are connected in common to form a word line row by row, drains of the transistors are connected in common to form a bit line column by lolumn, and sources of all the transistors are connected in common to form a common source line, comprising the steps of applying a predetermined first voltage to all the word lines while a predetermined second voltage is applied to the common source line to perform batch erasure, detecting whether or not threshold voltages of all the transistors in a word line or a group of word lines is lower than a predetermined so as to perform partial verification, applying the first voltage to a word line or a group of word lines which includes any transistor having a threshold voltage higher than the predetermined value while the second voltage is applied to the common source line so as to perform partial erasure, and repeating the partial verfication and the partical erasure until the threshold voltages of all the transistors are lower than the predetermined value.

The method for controlling erasure of a nonvolatile semiconductor memory according to the present invention is characterized in that an erase inhibiting voltage is applied to a word line or a group of word lines whose transistors all have a threshold voltage lower than the predetermined value after the partial verification.

Furthermore, the method for controlling erasure of a nonvolatile semiconductor memory according to the present invention is characterized in that the erase inhibiting voltage has the same polarity as that of the second voltage applied to the common source line.

Moreover, the method for controlling erasure of a nonvolatile semiconductor memory according to the present invention is characterized in that the erase inhibiting voltage is equal to the second voltage applied to the common source line.

In addition, the present invention provides a method for controlling erasure of a nonvolatile semiconductor memory having memory cells in which floating gate type MOS transistors are arranged in a matrix, control gates of the transistors are connected in common to form a word line row by row, drains of the transistors are connected in common to form a bit line column by column, and sources of all the transistors are connected in common to form a common source line, comprising the steps of applying a predetermined negative voltage to all the word lines while a predetermined positive voltage is applied to common source line to perform batch erasure, detecting whether or not threshold voltages of all the transistors in a word line or a group of word lines is lower than a predetermined value so as to perform partial verification, applying the predetermined negative voltage to a word line or a group of word lines which includes any transistor having a threshold voltage higher than the predetermined value while the second voltage is applied to the common source line so as to perform partial erasure, and repeating the partial verification and the partial erasure until the threshold voltages of all the transistors are lower than the predetermined value.

Furthermore, the method for controlling erasure of a nonvolatile semiconductor memory according to the present invention is characterized in that an erase inhibiting voltage is applied to a word line or a group of word lines whose transistors all have a threshold voltage lower than the predetermined value after the partical verification.

Moreover, the method for controlling erasure of a nonvolatile semiconductor memory according to the present invention is characterized in that the erase inhibiting voltage has the same polarity as that of the predetermined positive voltage applied to the common source line.

In addition, the method for controlling erasure of a nonvolatile semiconductor memory according to the present invention is characterized in that the erase inhibiting voltage is equal to the predetermined positive voltage applied to the common source line.

As described above, in the case where batch erasure is performed in the memory cells having common source line, the erase pulse is inhibited from being applied to a sector (a word line or a group of word lines) in which it is recognized that all the cells have been erased. Consequently, the erase pulse is inhibited from being applied to a cell which is easily changed to have a lower threshold. For this reason, the threshold is not lowered any more. As a result, the distribution of the threshold can be tight. Accordingly, a threshold of the erase reference cell can be lowered, and read can be performed without boosting the word line by using a power supply having a low voltage. Thus, high-speed read and low power consumption can be realized. Furthermore, excessive erasure can be prevented so that a lifetime of the cell can be prolonged.

A preferred embodiment of the present invention will be described below in detail.

FIG. 1 is a diagram showing a structure of a memory array section according to the present invention.

A source of each memory cell MC of a memory array is common. A common source line SL is connected to an erase circuit 11. An erase signal E is inputted to a word decoder 12 and the erase circuit 11. Address signals A6 to A16 are inputted to the word decoder 12. Erase inhibiting signals inh0 to inh254 are inputted to each sector. Furthermore, data (D0 to D7) and address signals A0 to A5 are inputted to a column decoder 13. Accordingly, the number of word lines WL is m (for example, m=2048) and that of bit lines BL is n (for example, n=512).

The principle of writing and reading operation is the same as in the prior art.

During erasure, the erase circuit 11 is activated by the erase signal E and a positive voltage Vns (for example, 6 V) is applied to the common source line SL. Furthermore, a negative voltage Vneg (for example, −10 V) is outputted from the word decoder 12 to all the word lines by the erase signal E. Accordingly, each cell has terminal voltages: a control gate voltage=Vneg, a source voltage=Vns, and a drain voltage=open. In a word line negative voltage erasing type flash memory, a negative voltage is applied to a word line by an erase pulse.

Figure 10:
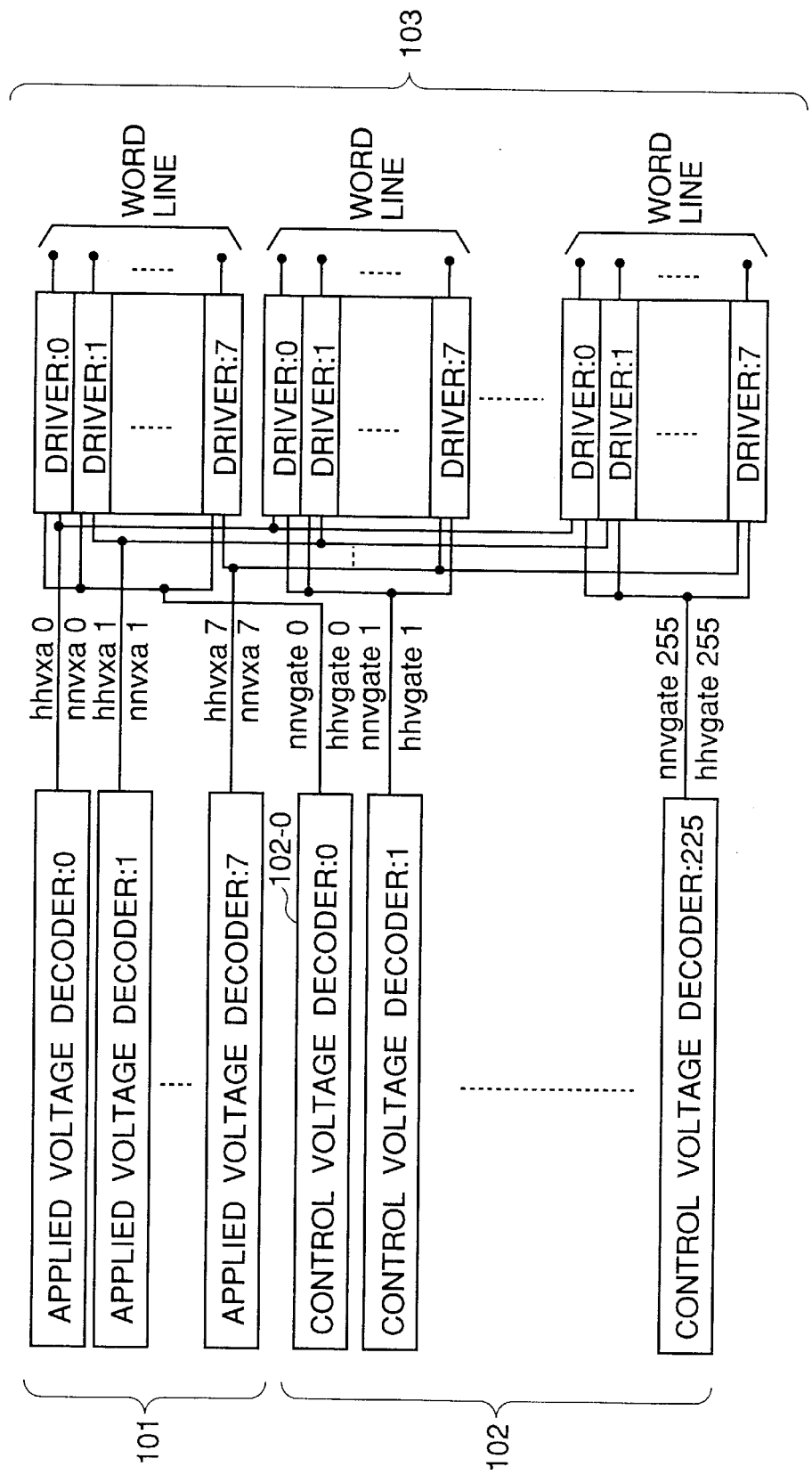
FIG. 10 is a diagram showing a structure of a word decoder according to the present invention.

FIG. 10 is a diagram showing a structure of a word decoder according to the present invention. As is apparent from the drawing, the word decoder is comprised an applied voltage decoder section 101, a control voltage decoder section 102 and a driver section 103. A voltage is applied to a word line as follows. A voltage outputted from the applied voltage decoder section 101 is selected by the control voltage decoder section 102. The selected voltage is applied to the word line through the driver section 103. While only one signal is inputted from the applied voltage decoder section 101 to the driver section 103 as shown in FIG. 10, two signals hhvxa and nnvxa are actually used. While only one signal is inputted from the control voltage decoder section 102 to the driver section 103, two signals hhvgate and nnvgate are actually used. If the number of word lines is 2048, 8 applied voltage decoders and 256 control voltage decoders are prepared. To one control voltage decoder is outputted 8 word lines to which a sector unit (512 bytes) is connected.

Figure 11:
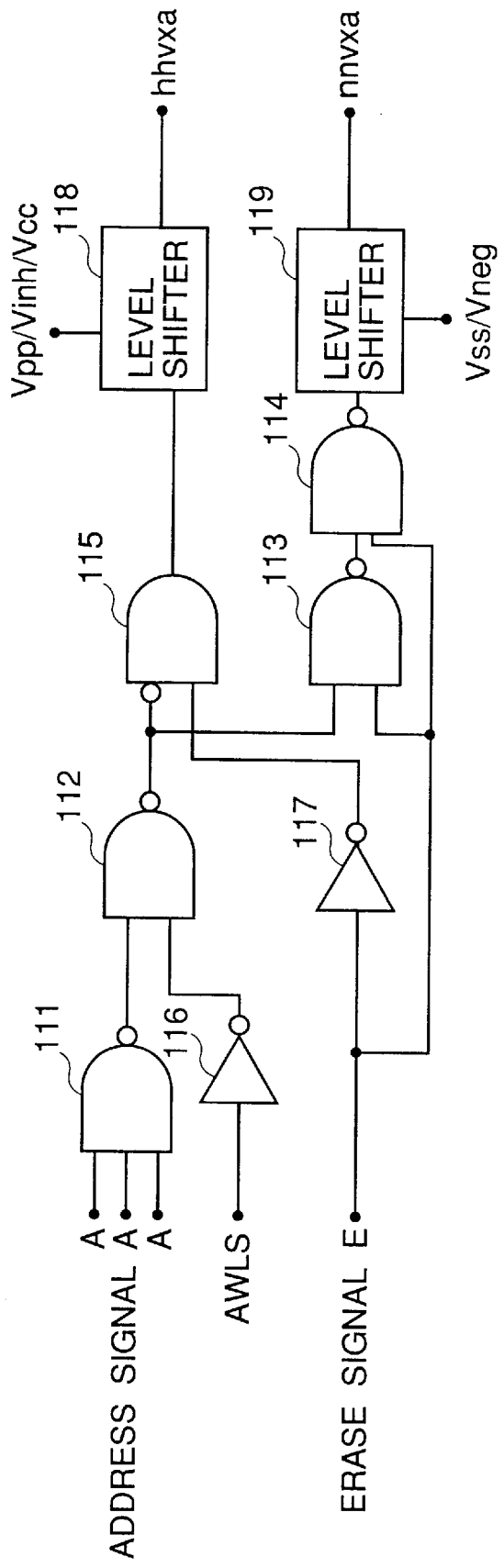
FIG. 11 is a circuit diagram showing an applied voltage decoder provided in the word decoder according to the present invention.
Figure 12:
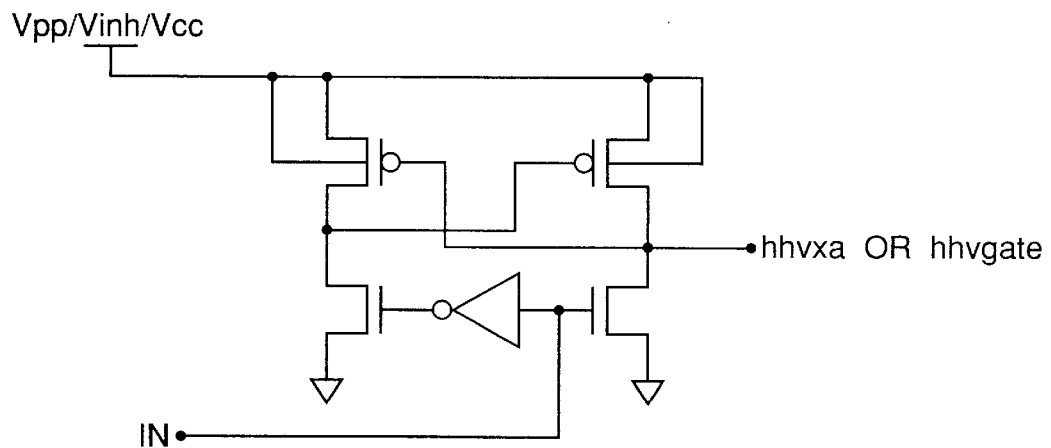
FIG. 12 is a circuit diagram showing a level shifter.
Figure 13:
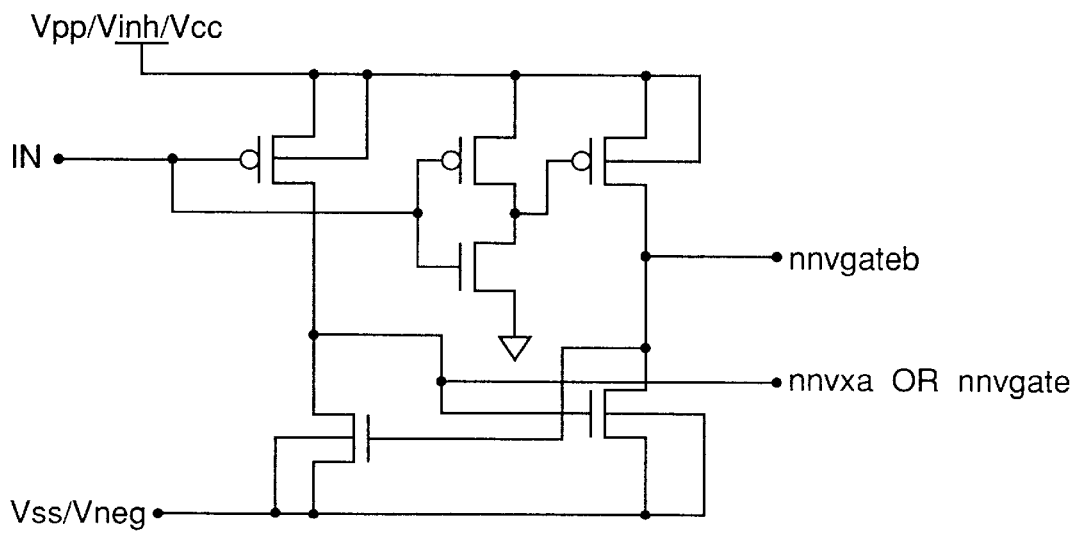
FIG. 13 is a circuit diagram showing another level shifter.

FIG. 11 shows an example of a circuit for implementing the applied voltage decoder comprising NAND gates 111, 112, 113 and 114, an AND gate 115, inverters 116 and 117, and level shifters 118 and 119. An address signal A, an all word line selection signal AWLS and an erase signal E are inputted to the circuit. In addition, output signals hhvxa and nnvxa are outputted from the circuit. Since 8 applied voltage decoders are provided, there are output signals hhvxa0 to hhvxa7 and nnvxa0 to nnvxa7 in all. FIGS. 12 and 13 show specific circuits of the level shifters 118 and 119, respectively.

During erasure, the all word line selection signal AWLS and the erase signal E are set to 5 V and a voltage of the NAND gate 112 is set to 5 V irrespective of the state of the address signal. The outputs of the AND gate 115 and the NAND gate 113 are set to 0 V and the output of the NAND gate 114 is set to 5 V. During the erasure, Vinh (3 V) is selected as a voltage of the level shifter 118 from Vpp/Vinh/Vcc. Since the input signal is 0 V, the output hhvxa has a voltage of 3 V (Vinh) as is apparent from the circuit shown in FIG. 12. In addition, Vneg (−10 V) is selected as a voltage of the level shifter 119 from Vss/Vneg during the erasure. As is apparent from FIG. 13, accordingly, the output nnvxa has a voltage of −10 V (Vneg).

During verification, the all word line selection signal AWLS is set to 0 V and the address signal A of the selected address is set to 5 V. Accordingly, the output of the NAND gate 111 is set to 0 V and that of the NAND gate 112 is set to 5 V. Furthermore, since the erase signal E has a voltage of 0 V, the outputs of the AND gate 115 and the NAND gate 113 are set to 0 V and 5 V, respectively, and the output of the NAND gate 114 is set to 5 V. During verification, Vcc (5 V) is selected from Vpp/Vinh/Vcc and Vss (0 V) is selected from Vss/Vneg. Accordingly, the outputs hhvxa and nnvxa are set to 5 V and 0 V, respectively. During non-selection, any of or all the address signals have a voltage of 0 V. Accordingly, the outputs of the AND gate 115 and the NAND gate 113 are set to 5 V. Accordingly, the outputs hhvxa and nnvxa are set to 0 V (Vss is selected from Vss/Vneg).

Table 1 shows a voltage of each signal in the applied voltage decoder section obtained during erasure and verification.

TABLE 1

| Signals | A | AWLS | E | hhvxa | nnvxa |
|---|---|---|---|---|---|
| During erasure | X | 5 V | 5 V | 3 V | −10 V |
| During Verification (Selection) | 5 V | 0 V | 0 V | 5 V | 0 V |
| During Verification (Non-selection) | 0 V | 0 V | 0 V | 0 V | 0 V |

X: don't care

Figure 14:
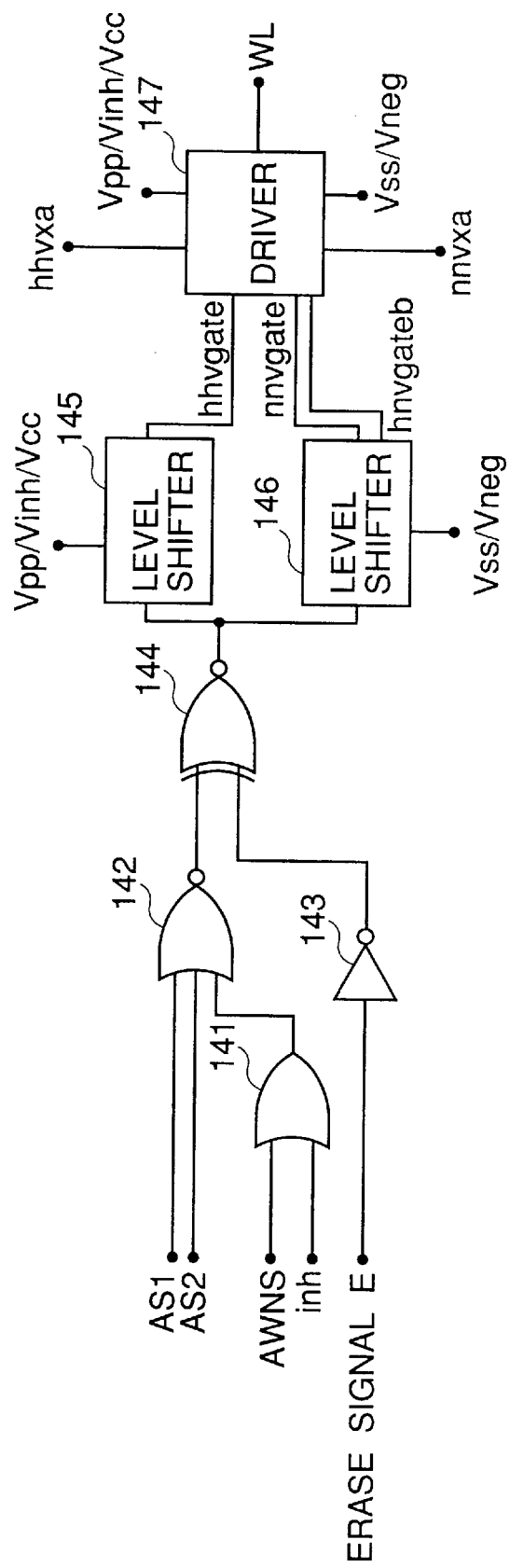
FIG. 14 is a circuit diagram showing a control voltage decoder provided in the word decoder according to the present invention.

FIG. 14 shows an example of a circuit including a control voltage decoder and a driver section, comprising an OR gate 141, a NOR gate 142, an inverter 143, an exclusive NOR gate 144, level shifters 145 and 146, and a driver 147. Address selection signals $AS_1$ and $AS_2$, an all word line non-selection signal AWNS, an erase inhibiting signal inh and an erase signal E are inputted to the circuit. The address selection signals $AS_1$ and $AS_2$ are generated by inputting an address signal from an outside to a predecoder and decoding the same address signal therein.

The control voltage decoder corresponds to 1st to 255th sectors. A 256th sector is a final sector to be described below. Consequently, if the final sector is completely erased, erasure is terminated. Accordingly, it is not necessary to inhibit the final sector from being erased. Therefore, the erase inhibiting signal inh which acts as an input signal of the OR gate 141 is set to 0 V. Consequently, the erase inhibiting signal is represented by inh0 to inh254.

Figure 15:
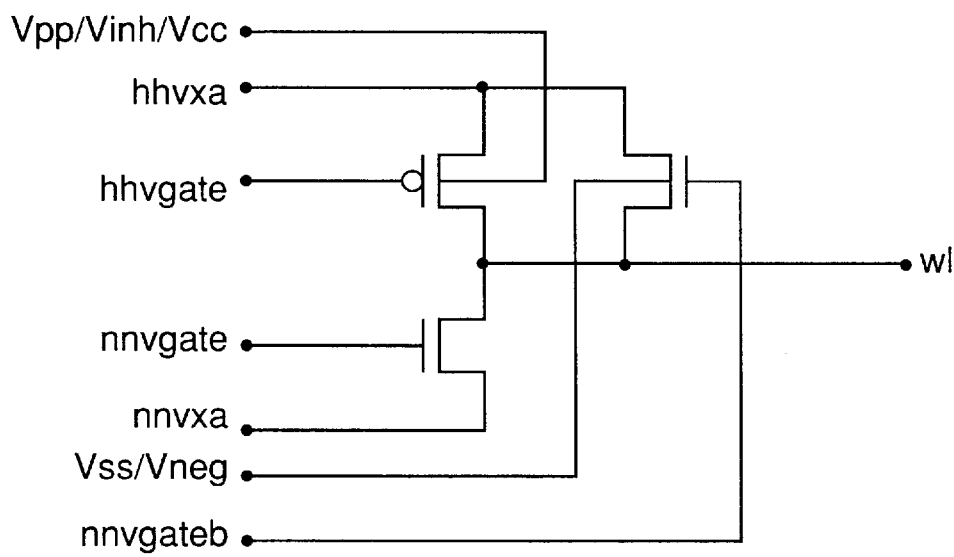
FIG. 15 is a circuit diagram showing a word line driver provided in the word decoder according to the present invention.

During erasure, the address selection signals $AS_1$ and $AS_2$ which are predecoded have a voltage of 0 V (Vss). Before erasure is completed, the all word line non-selection signal AWNS and the erase inhibiting signal inh have a voltage of 0 V and an output of the OR gate 141 has a voltage of 0 V. Accordingly, an output of the NOR gate 142 has a voltage of 5 V and the erase signal E has a voltage of 5 V. Consequently, an output of the exclusive NOR gate 144 is set to 0 V. At this time, Vinh (3 V) is selected as a voltage of the level shifter 145 (having the same structure as that of the level shifter 118 shown in FIG. 12) from Vpp/Vinh/Vcc. As is apparent from FIG. 12, consequently, an output (hhvgate) has a voltage of 3 V. On the other hand, Vneg (−10 V) is selected as a voltage of the level shifter 146 (having the same structure as that of the level shifter 119 shown in FIG. 13) from Vss/Vneg. As is apparent from FIG. 13, an output nnvgateb has a voltage of −10 V and an output nnvgate has a voltage of 3 V. At this time, the outputs hhvxa and nnvxa have voltages of 3 V and −10 V respectively as described above. In the driver 147 whose structure is shown in FIG. 15, Vinh (3 V) and Vneg (−10 V) are selected from Vpp/Vinh/Vcc and Vss/Vneg during erasure. Accordingly, an output WL has a voltage of −10 V.

After verification, the erase inhibiting signal inh inputted to the control voltage decoder corresponding to a sector in which it is decided that erasure has been completed is set to Vcc (5 V).

Figure 16:
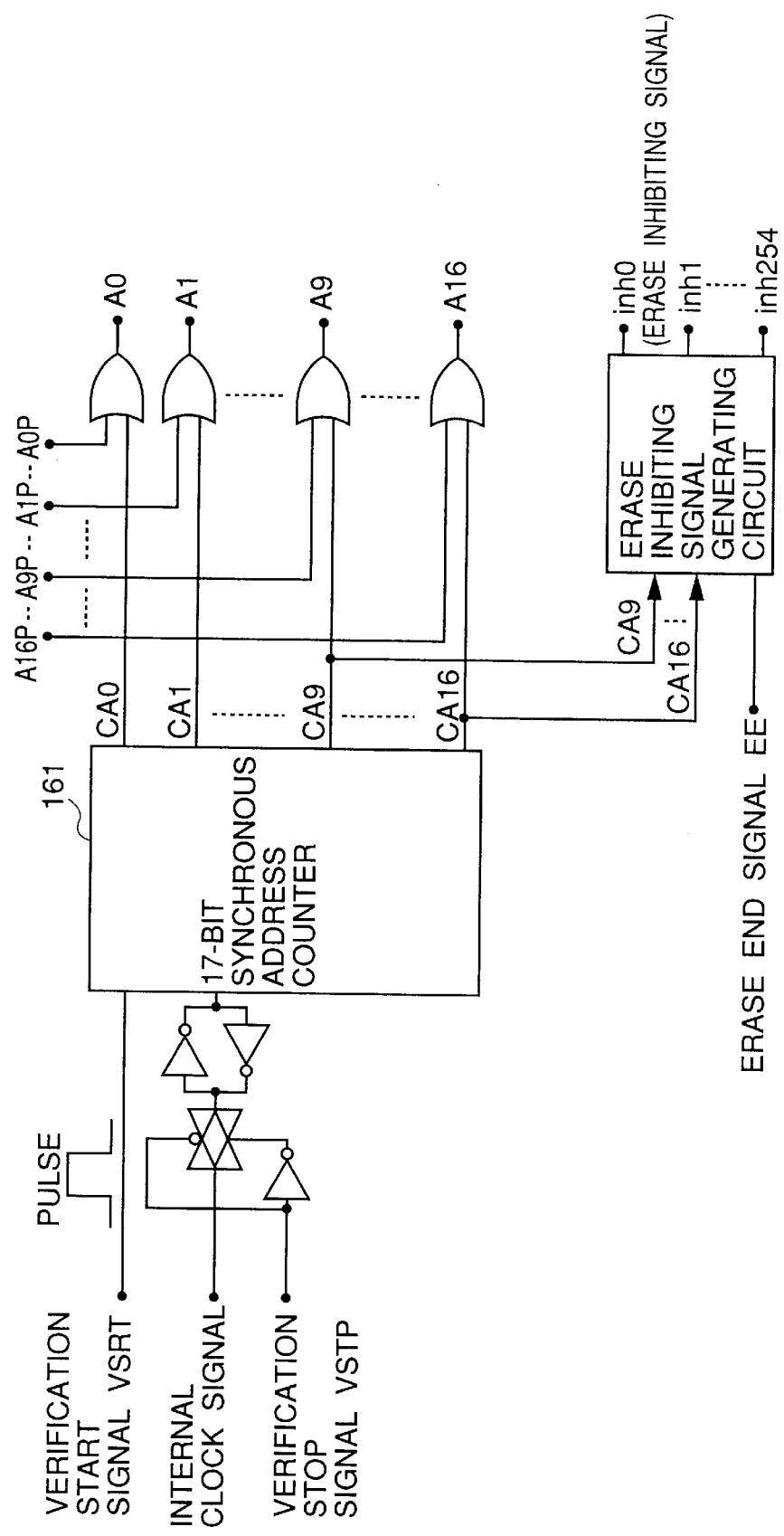
FIG. 16 is a diagram showing a circuit for generating an internal address signal and an erase inhibiting signal during verification.
Figure 17:
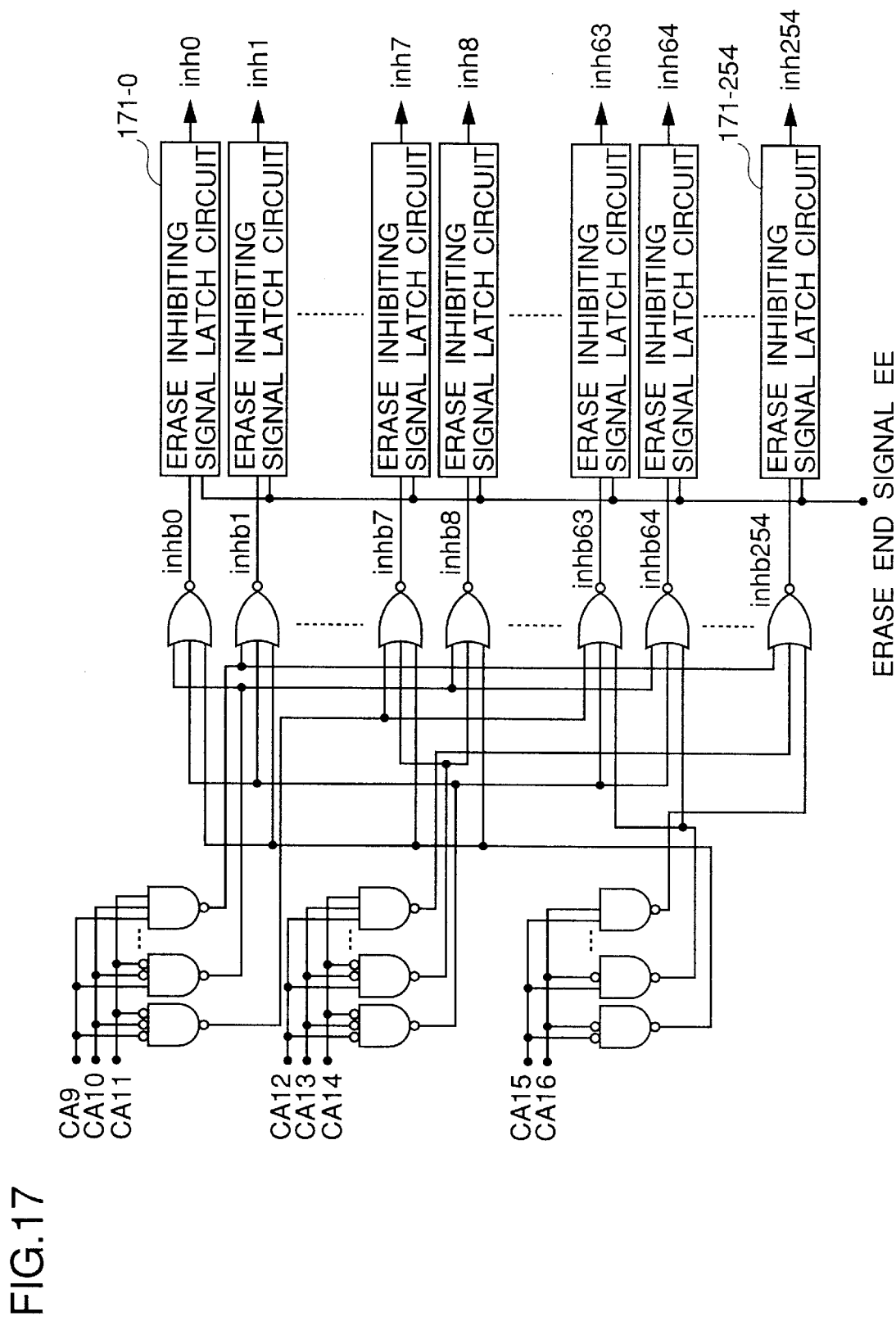
FIG. 17 is a diagram showing an erase inhibiting signal generating circuit.

The erase inhibiting signal inh is generated from a circuit shown in FIG. 16. A0P to A16P denote address signals which are directly sent from a pad. A0 to A16 denote internal address signals inputted to the word decoder, the column decoder and the like. CA0 to CA16 denote outputs of a 17-bit synchronous address counter 161. An address is increased by an internal clock signal. As shown in FIG. 17, an erase inhibiting signal generating circuit 162 has the function of decoding 8-bit signals of CA9 to CA16 and sequentially setting the erase inhibiting signal (5 V) every time it is decided that one sector has been erased completely.

Figure 18:
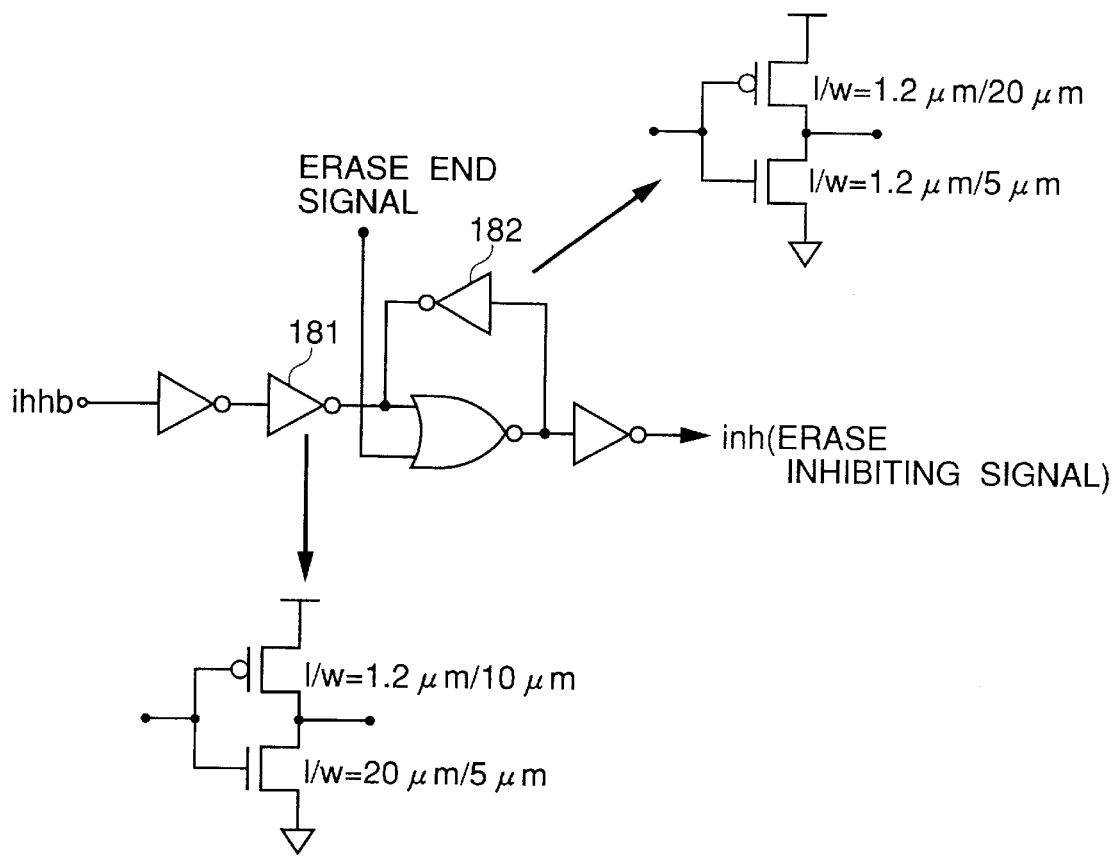
FIG. 18 is a diagram showing an erase inhibiting signal latch circuit.

At first, all the erase inhibiting signals are set to 0 V. When 8 bits of CA16 to CA9 are set to 00000001 (01H) (indicative of erase end of a first sector), an erase inhibiting signal inhb0 is set to 5 V. 5 V is latched onto an erase inhibiting signal latch circuit $171_0$ whose structure is shown in FIG. 18, and an output inh0 has a voltage of 5 V. This voltage is kept at 5 V until an erase end signal EE is inputted. Such a circuit can be obtained by setting a channel resistance of an n-MOS transistor of an inverter 181 much higher than that of a p-MOS transistor of an inverter 182 (for example, 1 and w shown in FIG. 18).

When verification is started, a verification start signal VSRT (pulse) is inputted to the 17-bit synchronous counter 161. An internal clock signal is inputted so that a counter operates to start the verification. The addresses of the counter (CA0 to CA16) are increased to continue the verification until a cell having a higher threshold than anticipated, that is, an insufficiently erased cell is detected.

If the insufficiently erased cell is detected, the verification is stopped so that a verification stop signal VSTP is set to 5 V and the internal clock signal is stopped. Consequently, the address of the 17-bit synchronous counter is not increased.

When an erase pulse is applied and the verification is started again, the verification stop signal VSTP is set to 0 V so that the internal clock signal is inputted. Consequently, the address of the synchronous counter is started to be increased again. As described above, when the first sector is completely erased, the erase inhibiting signal inh0 is set to 5 V.

If it is decided that a 255th sector has been erased completely, a signal inh254 is set to 5 V. Furthermore, when the 256th sector (final sector) is erased completely, erasure is ended so that the erase end signal EE is set to 5 V and the erase inhibiting signal latch circuit is reset. Accordingly, a signal for inhibiting erasure of the final sector is not needed. Therefore, the erase inhibiting signal inh which acts as an input signal of the OR gate 141 of the control voltage decoder corresponding to the final sector is set to 0 V (the erase inhibiting signal is indicated at inh0 to inh254).

As described above, the erase inhibiting signal is outputted.

When the erase inhibiting signal is inputted, the outputs of the OR gate 141 and the NOR gate 142 are set to 5 V and 0 V respectively, the output of the exclusive NOR gate 144 is changed to 5 V, the output hhvgate of the level shifter 145 is set to 0 V, the outputs nnvgate and nnvgateb of the level shifter 146 are set to −10 V and 3 V respectively, and an erase inhibiting voltage of 3 V is outputted to the word line WL. This erase inhibiting voltage may be about 2 V to 4 V on the above-mentioned erasing conditions.

In the case where the address is selected during the verification, the address selection signals $AS_1$ and $AS_2$ are set to 0 V. The all word line non-selection signal AWNS and the erase inhibiting signal inh are set to 0 V, and the output of the OR gate 141 is set to 0 V. Since the output of the NOR gate 142 is set to 5 V and the erase signal E is set to 0 V, the output of the exclusive NOR gate 144 is set to 5 V. Vcc and Vss are selected as voltages of the level shifters 145 and 146, and Vpp and Vss are selected as a voltage of the word driver 147. Accordingly, hhvgate, nnvgate and nnvgateb are set to 0 V, 0 V and 5 V respectively, and hhvxa and nnvxa are set to 5 V and 0 V respectively. Consequently, a signal having a voltage of 5 V is outputted to the word line WL. In case of non-selection, any of the address selection signals is set to 5 V and the output of the NOR gate 142 is set to 0 V. Since the output of the exclusive NOR gate 144 has a voltage of 0 V, the outputs hhvgate, nnvgate and nnvgateb of the level shifters 145 and 146 are set to 5 V, 5 V and 0 V, and a signal having a voltage of 0 V is outputted to the word line WL.

Table 2 shows a voltage of each signal obtained during erasure of the control voltage decoder.

TABLE 2

| | AS | AS | AWNS | inn | hhvgate | nnvgate | nnvgateb | WL |
|---|---|---|---|---|---|---|---|---|
| (1) | 0 V | 0 V | 0 V | 0 V | 3 V | 3 V | −10 V | −10 V |
| (2) | 0 V | 0 V | 0 V | 5 V | 0 V | −10 V | 3 V | 3 V |
| (3) | 0 V | 0 V | 0 V | 0 V | 0 V | 0 V | 5 V | 5 V |
| (4) | 5 V | 5 V | 0 V | 0 V | 5 V | 5 V | 0 V | 0 V |

*(1): Sector before erasing completion
*(2): Erasing completed sector
*(3): During verification (selection)
*(4): During verification (Non-selection)

Figure 19:
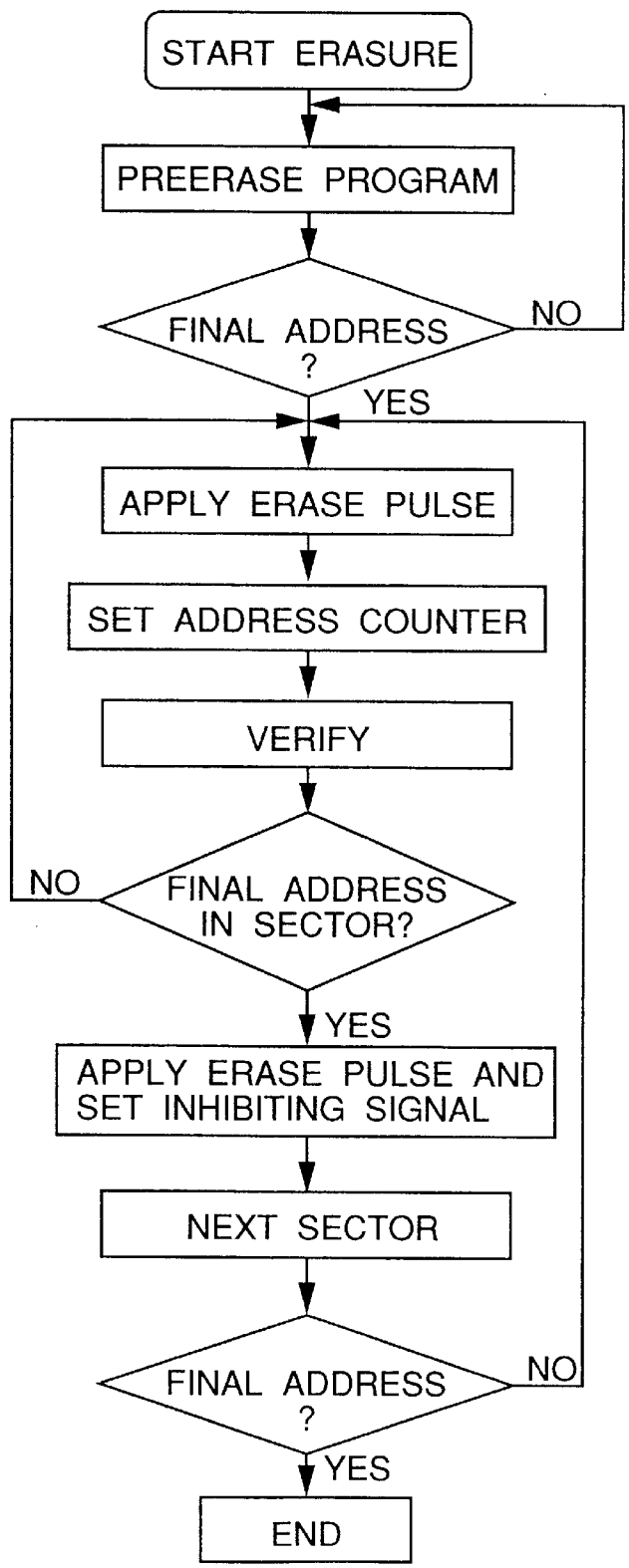
FIG. 19 is a flowchart showing an erase sequence according to the present invention.
Figure 20:
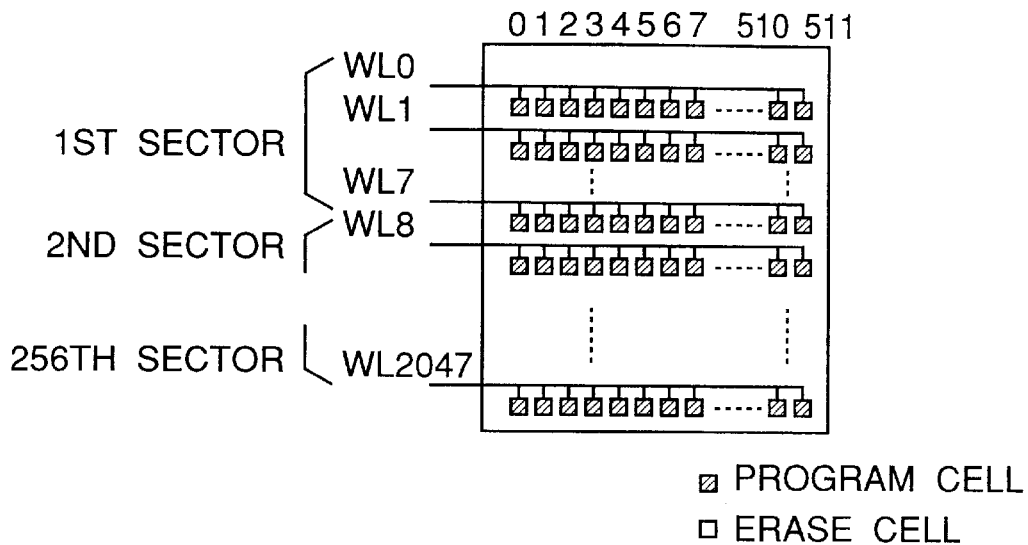
FIG. 20 is a diagram showing the state of a memory cell obtained after preerase write has been completed.

FIG. 19 shows an erase sequence applied to the present invention. When a command is received to start erasure, preerase write is performed to prevent overerasure in the same manner as in a flash memory according to the prior art. Accordingly, all the cells are in the writing state before applying the erase pulse as shown in FIG. 20. Then, the erase pulse is applied to all the cells.

When the erasure is started, a voltage of 6 V is first applied to a common source line and the cells are brought into the erasing setup state. Then, the erase signal is set to 5 V and the all word line selection signal is set to 0 V so that a signal having a voltage of −10 V is outputted to all the word lines as described above (the erase pulse is applied). Consequently, the thresholds of all the cells are lowered. During the verification, a signal having a voltage of 5 V is outputted to a selected word line, and a signal having a voltage of 0 V is outputted to a non-selected word line as described above. Thus, when the verification is first begun from a first address and an insufficiently erased cell is detected, the verification is stopped to apply the erase pulse again.

Figure 21:
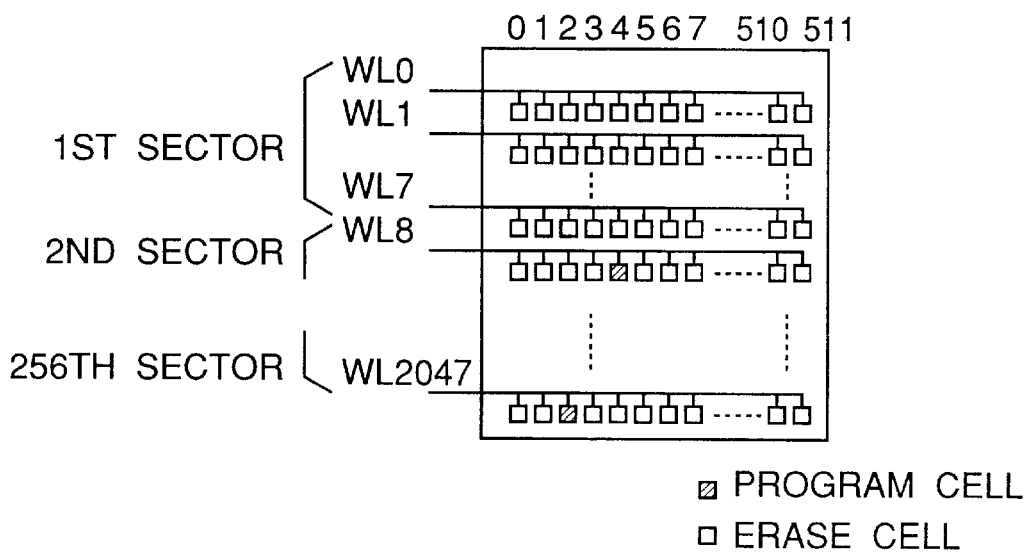
FIG. 21 is a diagram showing the state of the memory cell which is being erased.

The next verifying operation is started on the same cell. As shown in FIG. 21, if it is decided that a first sector (a cell connected to word lines WL0 to WL7 in this case: 512B) has been erased completely, the erase inhibiting signal of the control voltage decoder $102_0$ shown in FIG. 10 is set to 5 V. Accordingly, when the next erase pulse is applied, an erase inhibiting voltage of 3 V is outputted to the word lines WL0 to WL7 connected to the control voltage decoder $102_0$ by the above-mentioned circuit operation. The thresholds of the cells connected to the word lines WL0 to WL7 are not lowered any more.

As shown in FIG. 21, a word line WL8 of a second sector has an insufficiently erased cell. For this reason, a voltage of −10 V is outputted to the word lines WL8 to WL2047 to apply the erase pulse so that the thresholds of the cells connected to these word lines are further lowered. This operation is repeated until the final sector (the 256th sector) is completely erased. In the sector in which it is decided that erasure has been completed, a signal having a voltage of −10 V is not outputted to the word line and the erase pulse is not applied thereto as described above.

In a structure of the memory array section according to the present invention shown in FIG. 1, also in the case where a high potential Vpp (for example, 12 V) is applied to the source, a low voltage (for example, 0 V) is applied to the control gate during the erasure and the drain is brought into the floating state, an erase inhibiting signal can be set to an erasing completed sector, the high voltage Vpp can be applied as an erase inhibiting voltage to the word line and the application of the erase voltage can be inhibited. Consequently, the distribution of the threshold can be tight.

While erase inhibiting control is performed every sector (8 word lines) in the above-mentioned embodiment, the control may be performed every word line. It is apparent that the number of word lines forming the sector can be set optionally.

Furthermore, it is also possible to use a structure wherein first all cell erasing operation is executed, verification is then executed for all the sectors, and second erasing operation is executed for only a sector including a cell which is not sufficiently erased by the first erasing operation, and the erase inhibiting signal causes the erase voltage to be inhibited from being subsequently applied to a sector in which all cells have been erased completely. In this case, the second erasing operation is completed and the verification is then executed for all the sectors on which the second erasing operation has been performed. As a result, the erasing voltage is inhibited from being subsequently applied to the sector in which all the cells have been erased completely. Thereafter, the same processing is repeated to completely erase all the sectors.

According to the present invention, the distribution of the threshold can be tight as described above in detail. As a result, the threshold of the reference cell for erasure can be lowered, and read can be performed without boosting the word lines by using the power supply having a low voltage. Thus, high-speed read and low power consumption can be realized.

Although the present invention has fully been described by way of example with reference to the accompanying drawings, it is to be understood that various changes and modifications will be apparent to those skilled in the art. Therefore, unless otherwise such changes and modifications depart from the scope of the invention, they should be construed as being included therein.

What is claimed is:

1. A method for controlling erasure of a nonvolatile semiconductor memory having memory cells in which floating gate type MOS transistors are arranged in a matrix, control gates of the transistors are connected in common to form a word line row by row, drains of the transistors are connected in common to form a bit line column by column, and sources of all the transistors are connected in common to form a common source line, comprising the steps of;

applying a predetermined first voltage to all the word lines while a predetermined second voltage is applied to the common source line to perform batch erasure;

detecting whether or not threshold voltages of all the transistors in a word line or a group of word lines is lower than a predetermined value so as to perform partial verification;

applying the first voltage to a word line or a group of word lines which includes any transistor having a threshold voltage higher than the predetermined value while the second voltage is applied to the common source line so as to perform partial erasure;

and repeating the partial verification and the partial erasure until the threshold voltages of all the transistors are lower than the predetermined value.

2. The method for controlling erasure of a nonvolatile semiconductor memory as defined in claim 1, wherein an erase inhibiting voltage is applied to a word line or a group of word lines whose transistors all have a threshold voltage lower than the predetermined value after the partial verification.

3. The method for controlling erasure of a nonvolatile semiconductor memory as defined in claim 2, wherein the erase inhibiting voltage has the same polarity as that of the second voltage applied to the common source line.

4. The method for controlling erasure of a nonvolatile semiconductor memory as defined in claim 2, wherein the erase inhibiting voltage is equal to the second voltage applied to the common source line.

5. The method for controlling erasure of a nonvolatile semiconductor memory as defined in any of claims 1 to 4, wherein the first voltage is a predetermined negative voltage and the second voltage is a predetermined positive voltage.

* * * * *

UNITED STATES PATENT AND TRADEMARK OFFICE
CERTIFICATE OF CORRECTION

PATENT NO. : 5,831,905

DATED : November 3, 1998

INVENTOR(S) : Yasuaki Hirano

It is certified that error appears in the above-identified patent and that said Letters Patent is hereby corrected as shown below:

One the cover page, after "[22] Filed: Mar. 17, 1997"

insert: [30] Foreign Application Priority Data
May 27, 1996  [JP]   Japan    8 131913

Signed and Sealed this

Twentieth Day of April, 1999

*Attest:*

Q. TODD DICKINSON

*Attesting Officer*         *Acting Commissioner of Patents and Trademarks*